(12) United States Patent
Huang et al.

(10) Patent No.: US 12,519,009 B2
(45) Date of Patent: Jan. 6, 2026

(54) REPLACEMENT MATERIAL FOR BACKSIDE GATE CUT FEATURE

(71) Applicant: Taiwan Semiconductor Manufacturing Company, Ltd., Hsinchu (TW)

(72) Inventors: Wang-Chun Huang, Hsinchu (TW); Yu-Xuan Huang, Hsinchu (TW); Hou-Yu Chen, Hsinchu County (TW); Chih-Hao Wang, Hsinchu County (TW); Kuan-Lun Cheng, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/432,377

(22) Filed: Feb. 5, 2024

(65) Prior Publication Data
US 2024/0178052 A1    May 30, 2024

Related U.S. Application Data

(60) Continuation of application No. 17/818,601, filed on Aug. 9, 2022, now Pat. No. 11,894,260, which is a
(Continued)

(51) Int. Cl.
| | | |
|---|---|---|
| *H01L 21/762* | (2006.01) | |
| *B82Y 10/00* | (2011.01) | |
| *H01L 21/764* | (2006.01) | |
| *H10D 30/01* | (2025.01) | |
| *H10D 30/43* | (2025.01) | |
| *H10D 30/67* | (2025.01) | |

(Continued)

(52) U.S. Cl.
CPC ...... *H01L 21/76224* (2013.01); *H01L 21/764* (2013.01); *H10D 62/115* (2025.01); *H10D 84/0135* (2025.01); *H10D 84/0151* (2025.01); *H10D 84/038* (2025.01); *H10D 84/834* (2025.01)

(58) Field of Classification Search
CPC ............ H01L 21/76224; H01L 21/764; H01L 21/823481; H01L 29/0649; H01L 21/823878; H01L 2027/11829; H01L 27/11807; H01L 21/823842; H01L 27/092; H01L 29/7831; H01L 21/823437; H10D 62/115; H10D 84/0151; H10D 84/0135; H10D 84/834; H10D 30/6757; H10D 30/014; H10D 30/43; H10D 30/6735; H10D 62/121; H10D 84/0158; B82Y 10/00
See application file for complete search history.

(56) References Cited

U.S. PATENT DOCUMENTS

| | | |
|---|---|---|
| 9,236,267 B2 | 1/2016 | De et al. |
| 9,520,482 B1 | 12/2016 | Chang et al. |

(Continued)

*Primary Examiner* — Sonya McCall-Shepard
(74) *Attorney, Agent, or Firm* — HAYNES AND BOONE, LLP

(57) ABSTRACT

A semiconductor structure includes a substrate, a first gate structure and a second gate structure disposed over the substrate, and an isolation feature extending through the substrate and disposed between the first gate structure and the second gate structure. A top surface of the isolation feature is above a topmost surface of the first gate structure.

20 Claims, 13 Drawing Sheets

Related U.S. Application Data division of application No. 17/186,839, filed on Feb. 26, 2021, now Pat. No. 11,610,805.

(51) Int. Cl.
| | | |
|---|---|---|
| *H10D 62/10* | (2025.01) | |
| *H10D 84/01* | (2025.01) | |
| *H10D 84/03* | (2025.01) | |
| *H10D 84/83* | (2025.01) | |

(56) References Cited

U.S. PATENT DOCUMENTS

| | | | |
|---|---|---|---|
| 9,576,814 B2 | 2/2017 | Wu et al. | |
| 10,825,741 B2* | 11/2020 | Zang | H01L 27/0886 |
| 2016/0126310 A1 | 5/2016 | Rodder et al. | |
| 2018/0261514 A1* | 9/2018 | Xie | H01L 21/28185 |
| 2019/0334003 A1 | 10/2019 | Liang et al. | |
| 2020/0020570 A1* | 1/2020 | Sung | H10D 62/115 |
| 2020/0035567 A1 | 1/2020 | Chanemougame | |
| 2020/0043945 A1 | 2/2020 | Kim et al. | |
| 2020/0135848 A1 | 4/2020 | Lim | |
| 2020/0381432 A1* | 12/2020 | Lee | H01L 29/42392 |
| 2021/0035976 A1* | 2/2021 | Gwon | H01L 23/535 |
| 2021/0305244 A1* | 9/2021 | Bouche | H10D 84/83 |

* cited by examiner

REPLACEMENT MATERIAL FOR BACKSIDE GATE CUT FEATURE

PRIORITY

This is a continuation application of U.S. patent application Ser. No. 17/818,601, filed on Aug. 9, 2022, which is a divisional application of U.S. patent application Ser. No. 17/186,839, filed on Feb. 26, 2021, now U.S. Pat. No. 11,610,805, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
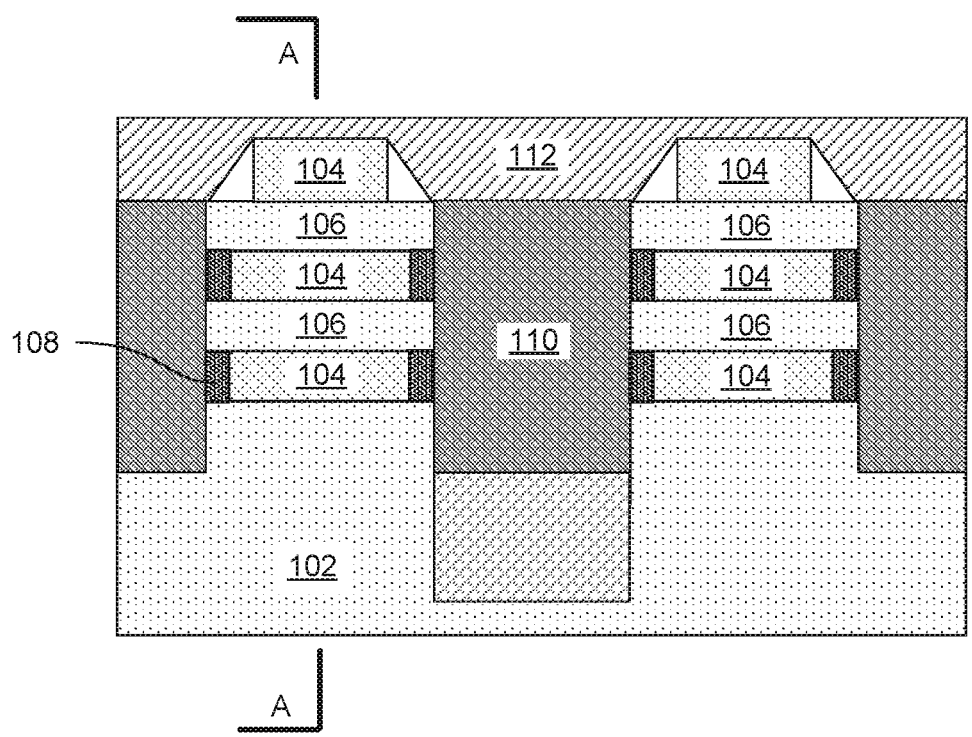
FIGS. 1A and 1B illustrate cross-sectional views of a semiconductor device according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to methods of fabricating field-effect transistors (FETs), such as fin-like FETs (FinFETs), nanosheet devices such as gate-all-around FETs (GAA FETs), and/or other FETs.

In some examples, to form a nanosheet device, a semiconductor fin may include a total of three to ten alternating layers of semiconductor materials. For example, the first semiconductor material may be silicon, and the second semiconductor material may be silicon germanium. Either of the semiconductor materials and (or both) may be doped with a suitable dopant, such as a p-type dopant or an n-type dopant, for forming desired FETs. The semiconductor materials and may each be formed by an epitaxial process, such as, for example, a molecular beam epitaxy (MBE) process, a CVD process, and/or other suitable epitaxial growth processes.

Alternating layers of the semiconductor materials are configured to provide nanowire or nanosheet devices, the details of forming which are provided below. Nanosheet devices have been introduced in effort to improve gate control by increasing gate-channel coupling, reduce OFF-state current, and reduce short-channel effects. A multi-gate device such as a nanosheet device generally includes a gate structure that extends around its channel region (horizontal or vertical), providing access to the channel region on all sides. The nanosheet device are generally compatible with CMOS processes, allowing them to be aggressively scaled down while maintaining gate control and mitigating short-channel effects. Of course, the present disclosure is not limited to forming nanosheet devices only and may provide other three-dimensional FETs such as FinFETs.

In a nanosheet device, a channel stack is formed by depositing alternating layers of semiconductor material that may be selectively etched. For example, a first type of semiconductor material may be epitaxially grown on a substrate. Then, a second type of semiconductor material may be epitaxially grown on that first layer. The process continues by forming alternating layers of the first and second semiconductor material. Then, the channel stacks may be patterned into fin structures. Each fin may thus be a fin stack of alternating semiconductor layers. Then, an etching process (e.g., a wet etching process) can be used to remove the second semiconductor material while leaving the first semiconductor material substantially intact. The remaining second semiconductor material may thus form a stack of nanowires or nanosheets extending between two active regions. A gate device can then be formed to completely surround each of the nanowires or nanosheets. On each side of the gate device is a source or drain region.

In conventional fabrication techniques, gate structures are fabricated as elongate structures that extend over several fin structures (which may include nanostructures). The long gate structures are then "cut" by removing a portion of the gate structure and then filling the void with a dielectric material to electrically isolate two portions of the gate structure. This dielectric material is referred to as a gate cut feature. The process of forming the gate cut feature is conventionally done from the front side of the wafer.

According to principles described herein, a gate cut feature is formed from the backside. Furthermore, to provide for better device performance, a new work-function metal layer is deposited within the space left by removing a function of the gate structure. In more detail, through a backside of a substrate, a portion of a gate structure is removed. This forms a trench that isolates the gate structure in two portions. Then, a sacrificial material is deposited within the trench conformally along sidewalls of the trench. Then, the remainder of the trench is filled with a dielectric material. The sacrificial material can then be at least partially removed to leave a space between the gate structure and the dielectric material. This space can then be filled with a replacement material such as a work-function metal. Thus, any damage that may be done to the gate structure during the etching process to form the trench, can be effectively repaired or mitigated.

Figure 1B:
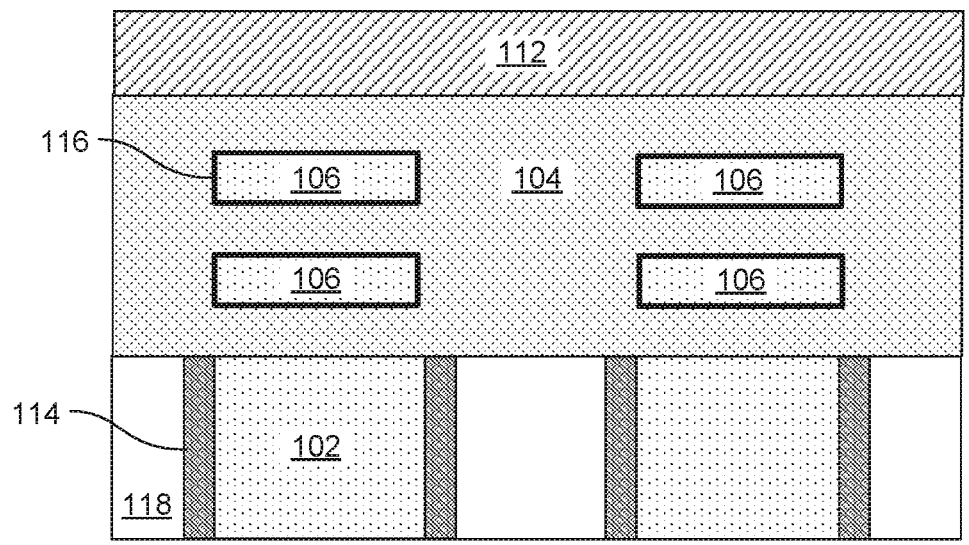

FIGS. 1A and 1B illustrate cross-sectional views of a semiconductor device ready for a backside gate cut feature process. FIG. 1A is a diagram showing a cross-sectional view of an illustrative workpiece. The workpiece includes a semiconductor substrate 102. In some embodiments, semiconductor substrate 102 has a fin-like shape. In at least one embodiment, semiconductor is known as a fin structure extending from a bulk substrate. The fin structure is used in a multi-gate device, such as a FinFET (fin field-effect transistor), a nanosheet transistor (e.g., a multi-channel transistor). The semiconductor substrate 102 may be a silicon substrate. The semiconductor substrate may be part of a silicon wafer. Other semiconductor materials are contemplated. The substrate 102 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof.

FIG. 1A illustrates fin stacks that include several channels 106 or nanostructures surrounded by gate structures 104. In some embodiments, channels 106 are also called nanosheets or nanowires. Between the fin stacks are source or drain structures 110. Inner spacers 108 are placed along the gate structures 104 between channels 106 to isolate the gate structure 104 from the source or drain structure 110.

To form this structure, a first type semiconductor layer is deposited on the substrate 102. The first type semiconductor material is a sacrificial material that will ultimately be removed. Thus, this layer will also be referred to as the sacrificial semiconductor layer. Then, a second type semiconductor material is deposited. The second type semiconductor layer will ultimately form part of the channel of a nanostructure transistor device. Thus, the second type semiconductor layer will also be referred to as a channel semiconductor layer. Formation of both the first type semiconductor material and the second type semiconductor material may be done using an epitaxial growth process. The process of forming the first type semiconductor material and the second type semiconductor material may be repeated until the desired number of layers are reached. After the desired number of semiconductor layers has been achieved, a dummy gate structure that will eventually be replaced with a real metal or conductive gate may be formed on top.

A patterning process is then used to form recesses within the semiconductor layers in the regions where the source and drain structures 110 are to be formed. The patterning process may include a photolithographic process. For example, a hard mask layer and a photoresist layer may be deposited upon the workpiece. The hardmask layer 118 may include at least one of silicon oxide ($SiO_2$), silicon nitride (SiN), silicon carbide (SiC), silicon oxynitride (SiON), silicon oxycarbide (SiOCN), hafnium oxide ($HfO_2$), aluminum oxide ($Al_2O_3$), and zirconium oxide ($ZrO_2$).

Then, the photoresist layer may be exposed to a light source through a photomask. The photoresist may then be developed. Then, an etching process may be applied to transfer the pattern in the photoresist to the hard mask layer. After this process, the hard mask exposes portions of the alternating set of layers. Then, a directional etching process such as a dry etching process is used to pattern the semiconductor layers.

A lateral etching process to partially remove the sacrificial semiconductor layers where the inner spacers 108 are to be formed. The lateral etching process may be, for example, a wet etching process. The etching process may be designed to be selective so as to remove the sacrificial semiconductor layer without substantially affecting the semiconductor layer. For example, in the case where the sacrificial semiconductor layer is silicon germanium and the semiconductor layer is silicon, then the etching process may be configured to remove silicon germanium without substantially affecting silicon.

Then, a deposition process is applied to form the inner spacers 108. Specifically, an inner spacer layer is formed by a conformal deposition process so that the inner spacer layer is formed along sidewalls of the recesses where the source or drain structures 110 are to be formed. The inner spacer layer may be a dielectric material such as SiCN, SiOCN, or SiON.

An etch back process may then be used to remove portions of the inner spacer layer and to expose the channel layers 106. The etch back process also removes the inner spacer layer from the floor of the recesses and the top of the workpiece. The remaining portions of the inner spacer layers serve to electrically isolate the portions of the gate structure 104 with the source and drain regions to be formed. In some examples, the remaining inner spacer layer may vary within a range of width between about 4-15 nanometers.

In some examples, where a backside contact is to be formed, the trench where the source/drain region is formed is further etched to create a deeper trench. Then, a dummy contact structure may be formed at the bottom of the trench. This may be done using an epitaxial growth process. The dummy contact structure may be, for example, made of silicon germanium without dopants.

After the dummy contact structure is formed, then the source/drain structures 110 can be formed. In some examples, the source and drain structures 110 are created by performing an epitaxial growth process. An epitaxial growth process involves forming a crystal structure on a crystal substrate. In the present example, the source and drain regions 110 are grown from the substrate 102 and channel regions 106. In some examples, the source and drain regions 110 may be doped in situ so as to obtain the desired properties.

After the source/drain structures 110 are formed, the dummy gate structure and the sacrificial semiconductor material may be replaced with a real gate 104. This may be done by removing the sacrificial semiconductor materials and the dummy with a wet etching process. The wet etching process may be selective so as to remove the sacrificial semiconductor layers leaving the channel layers 106 substantially intact. The wet etching process may use an acid-based etchant such as: sulfuric acid ($H_2SO_4$), perchloric acid ($HClO_4$), hydroiodic acid (HI), hydrobromic acid (HBr), nitric acide ($HNO_3$), hydrochloric acid (HCl), acetic acid ($CH_3COOH$), citric acid ($C_6H_8O_7$), potassium periodate ($KIO_4$), tartaric acid ($C_4H_6O_6$), benzoic acid ($C_6H_5COOH$), tetrafluoroboric acid ($HBF_4$), carbonic acid ($H_2CO_3$), hydrogen cyanide (HCN), nitrous acid ($HNO_2$), hydrofluoric acid (HF), or phosphoric acid ($H_3PO_4$). In some examples, an alkaline-based etchant may be used. Such etchants may include but are not limited to ammonium hydroxide ($NH_4OH$) and potassium hydroxide (KOH). By removing the sacrificial semiconductor layers, the channel layers 106 thus become nanostructures extending between source and drain structures 110.

After the dummy gate structure is removed, a real gate structure is formed. Formation of the real gate device may include a number of steps. For example, a high-k dielectric layer 116 may be deposited so as to surround the channel layers 106. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used.

In some examples, depending on the type of transistor device being formed, a work function layer may be deposited. Such metal is designed to metal gates the desired properties for ideal functionality. Various examples of a p-type work-function metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type work-function metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC). Then, a gate layer is deposited. The gate layer may be a conductive material such as a metal material. In this manner, the gate layer entirely surrounds each of the channel layers 106.

After the real metal gate has been formed, a dielectric layer 112 may be deposited over the real metal gates. The dielectric layer 112 may be, for example, an interlayer dielectric layer (ILD) or an etch stop layer. The dielectric layer 112 may include multiple layers with metal interconnects and other Front End of Line (FEOL) components.

FIG. 1B illustrates a cross-sectional view along cut A-A in FIG. 1A. In other words, FIG. 1B shows a cut along the gate structure 104. The cut is along a direction orthogonal to an extending direction of the gate structure. The dielectric layer 112 is deposited above the gate structure 104. As can be seen, the gate structure 104 entirely surrounds nanostructures 106 that act as channels for transistors. The channels are surrounded by a high-k dielectric layer 116 and at least one work function layer (not shown).

Below the gate 104, the fin structures 102 can be seen. The fin structures 102 are surrounded by spacers 114 and positioned within an isolation layer 118. In some embodiments, the isolation layer 118 includes silicon oxide ($SiO_x$, $1 \leq x \leq 2$). The spacers 114 may be a nitride material such as silicon nitride, and may be within a range of about 3-15 nanometers thick. In some embodiments, the spacers 114 includes a oxide material different from the isolation layer 118. The isolation layer 118 may be, for example, a shallow trench isolation (STI) region. FIG. 1B illustrates the workpiece in a state that is ready to form a backside gate contact.

Figure 2A:
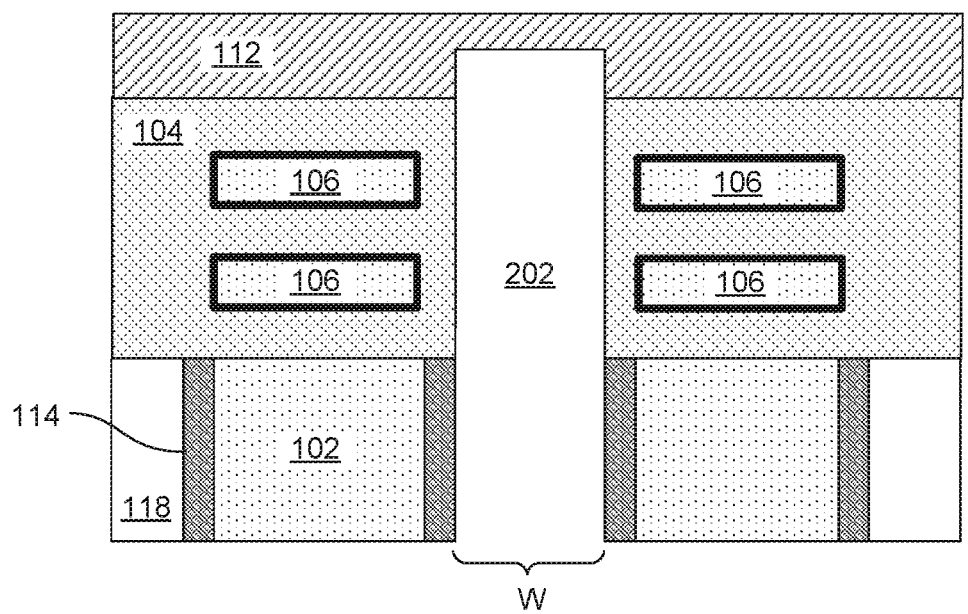
FIGS. 2A, 2B, 2C, 2D, 2E, 2F, 2G, and 2H are diagrams showing an illustrative process for fabricating a semiconductor structure with replacement material for a backside gate cut feature, according to one example of principles described herein.

FIGS. 2A, 2B, 2C, 2D, 2E, 2F, 2G, and 2H are diagrams showing an illustrative process for fabricating a semiconductor structure with replacement material for a backside gate cut feature. FIG. 2A illustrates an etching process by which a portion of the gate structure 104 is removed. The etching process may be, for example, a dry etching process. The etching process leaves a trench 202 that separates the gate structure 104 into two separate portions. The etching process also extends slightly into the dielectric layer 112. In some examples, a width W of the trench 202 is equal to or smaller than a width of the fin structure 102. The etching process may include forming the trench 202 parallel with at least one fin structure extending from the substrate. The trench 202 may be formed along a central line between two adjacent fin structures. In some examples, the trench 202 may be formed away from a central line between two adjacent fin structures.

Figure 2B:
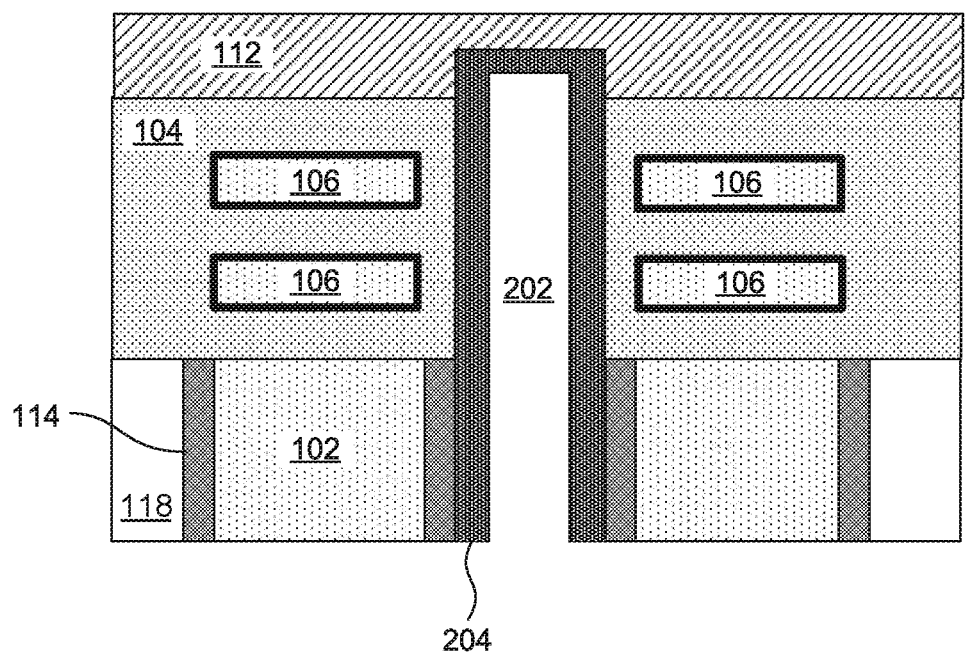

FIG. 2B illustrates a formation process by which a conformal sacrificial material 204 is deposited along the sidewalls of the trench. The sacrificial material 204 may be deposited using a conformal deposition process such as CVD, or ALD. Other deposition methods are contemplated. In some embodiments, a thickness of the sacrificial material 204 ranges from 1 nm to 10 nm. If the thickness is smaller than 1 nm, it is insufficient for the subsequent filling process, such as a metal deposition. If the thickness is greater than 10 nm, it is insufficient for the subsequent filling process, such as a dielectric deposition.

Figure 2C:
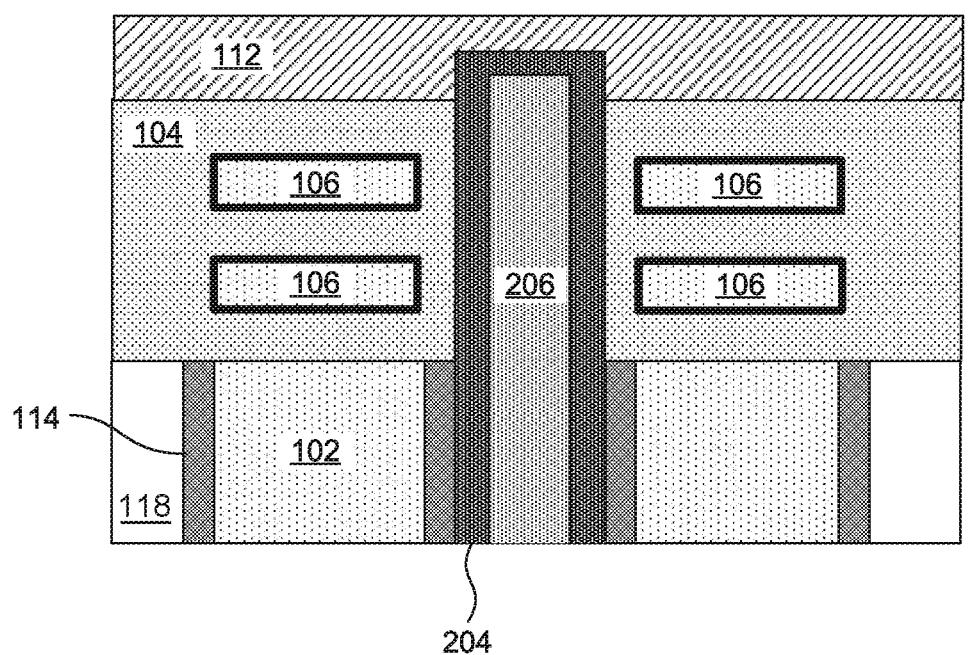

FIG. 2C illustrates a deposition process to fill the remaining portion of the trench 202 with an isolation material 206. This isolation material may be, for example, silicon oxide ($SiO_x$, $1 \leq x \leq 2$). Other oxides may be used as well. The isolation material 206 has an etching selectivity with the sacrificial material 204 formed along the walls of the trench. As will be explained more below, the etching selectivity allows the sacrificial material to be removed while the isolation material 206 remains substantially intact.

Figure 2D:
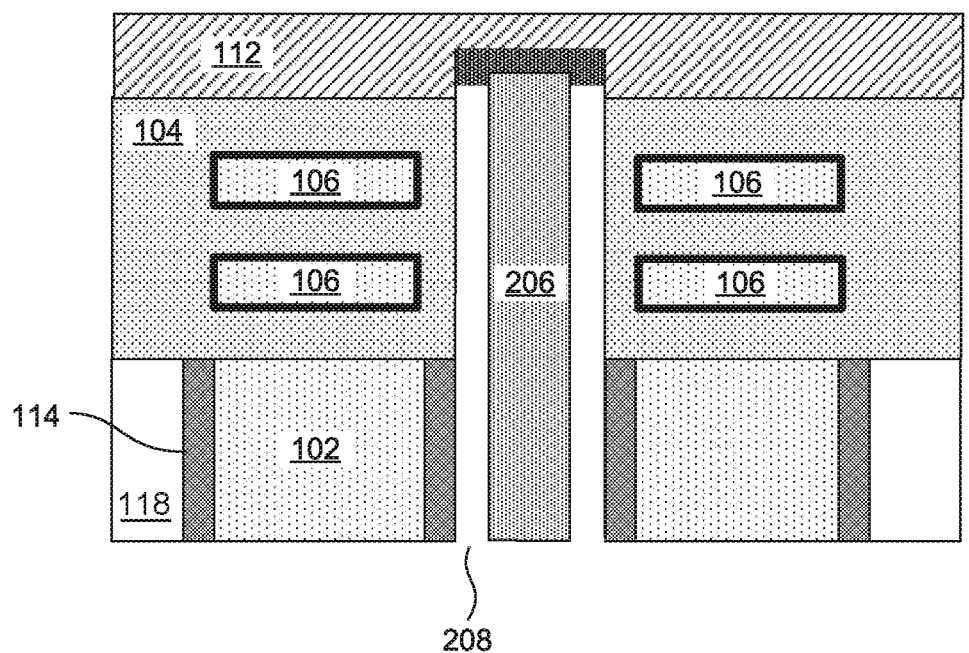

FIG. 2D illustrates a removal process by which the sacrificial material 204 is partially removed. The removal process may be either a wet etching or a dry etching process. The etching process may continue until the dielectric layer 112 is exposed. A small portion of the sacrificial material 204 remains within the dielectric layer 112. The removal process thus leaves an opening 208 between the isolation material 206 and the gate structure 104. It is possible that the etching process may damage various work-function metal layers that surround the channels 106. In some embodiments, a bottommost surface of the remaining sacrificial material 204 is substantially co-planar with a topmost surface of the isolation material 206. In some embodiments, the bottommost surface of the remaining sacrificial material 204 is below the topmost surface of the isolation material 206. In other words, an upper portion of the isolation material is covered by the remaining sacrificial material 204. In some embodiments, the bottommost surface of the remaining sacrificial material 204 is over a bottommost surface of the dielectric layer 112. In some embodiments, the bottommost surface of the remaining sacrificial material 204 is substantially co-planar with the bottommost surface of the dielectric layer 112. In other words, a bottom portion of the dielectric layer 112 is laterally exposed.

Figure 2E:
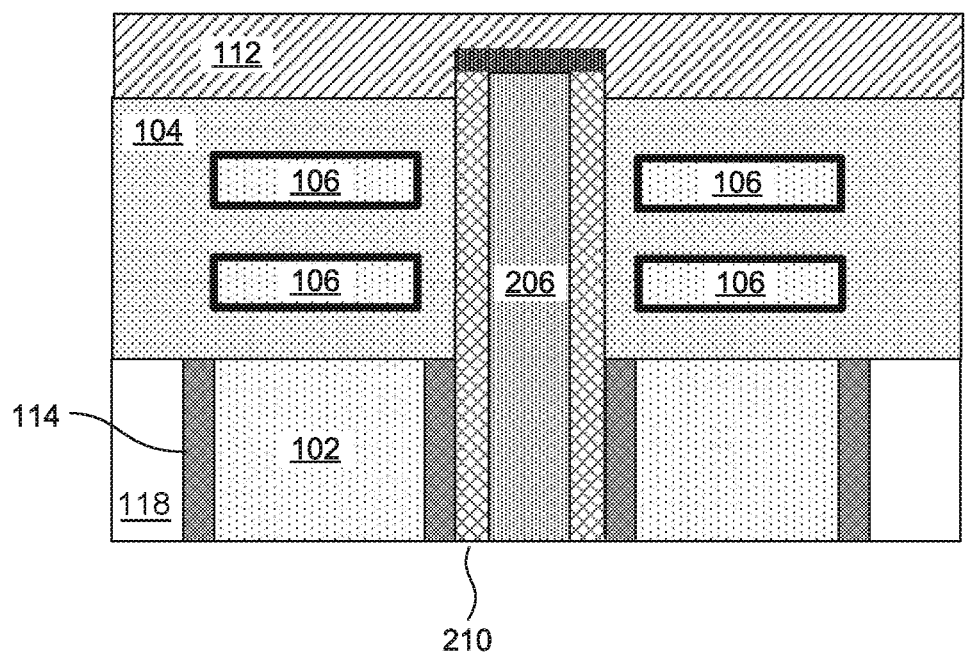

FIG. 2E illustrates a process by which a work-function layer 210 is deposited within the opening 208. The work-function layer 210 may be one of a variety of metals depending on the type of transistor being formed. Various examples of a p-type work-function metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type work-function metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC).

Figure 2F:
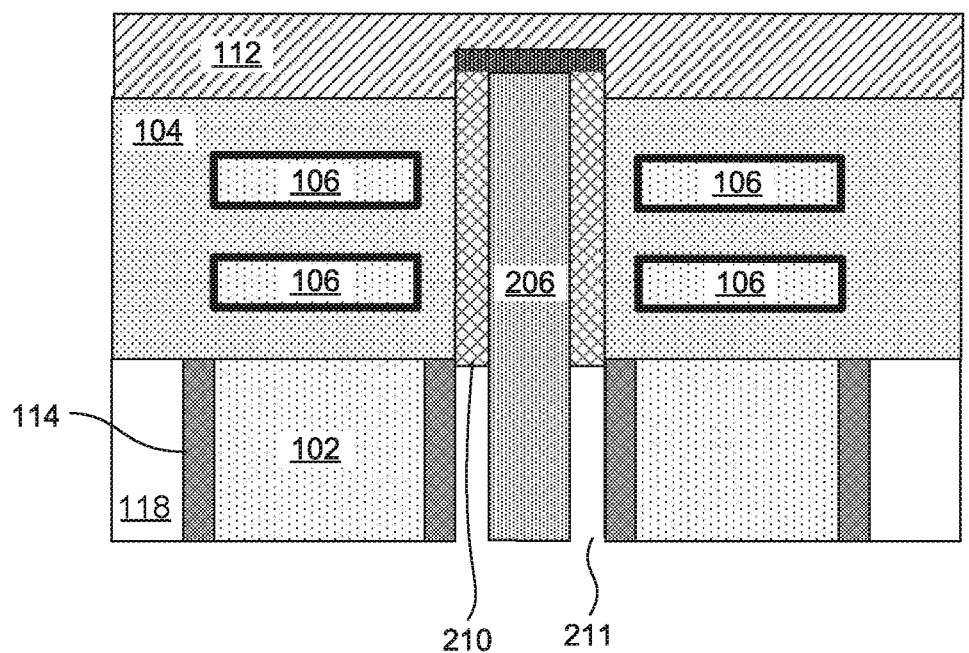

In some examples, the work-function layer 210 may be the same as at least one of work function materials formed around the channel regions 106. In at least one embodiment, the work-function layer 210 includes a same material as an outmost layer of the gate structure 104. However, in some examples, the work-function layer 210 may be different than the one formed around the channel layers. The composition of the work-function layer 210 may be customized for a specific device. This allows for finer tuning of the threshold voltage of the transistor device. Filling the opening with the work-function metal includes depositing the work function to entirely overlap sidewalls of the two portions of the gate structure with respect to a cross-sectional view. The filling process may also include depositing the work-function metal material to directly contact a spacer feature along a sidewall of a fin structure FIG. 2F illustrates a process by which the work-function layer 210 is partially removed. The removal process may be, for example, an etching process. Either a dry etching or a wet etching process may be used. The etching process is selective so as to partially remove the work-function layer 210 while leaving the isolation material 206 substantially intact. The etching process may stop before the work-function layer adjacent to the gate structure 104 is removed. The etching process leaves an opening 211. In some embodiments, a bottommost surface of the remaining work-function layer 210 is below a bottommost surface of the gate structure 104. In some embodiments, the bottommost surface of the remaining work-function layer 210 is substantially co-planar with the bottommost surface of the gate structure 104. The removal process may include partially etching an upper layer over the gate structure.

Figure 2G:
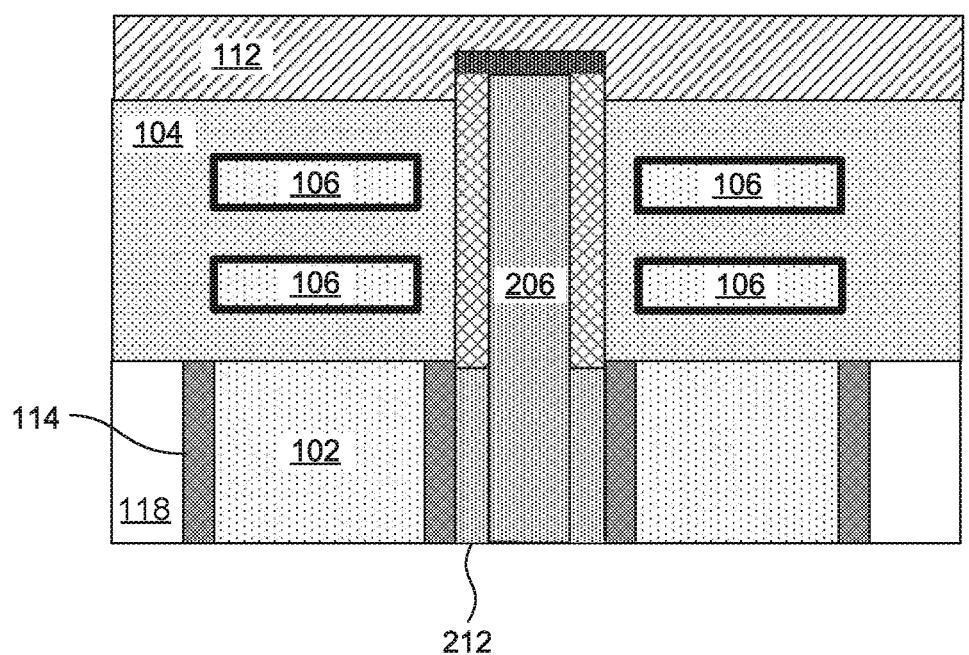

FIG. 2G illustrates a process by which a second isolation material 212 is filled into the opening 211. In some embodiments, the second isolation material 212 includes an oxide material. The second isolation material 212 may be the same material as isolation material 206. In some examples, however, it may be a different material. The second isolation material 212 may be deposited using an ALD or an CVD process. After the second isolation material 212 is deposited, a CMP process may be performed to planarize the backside surface of the workpiece.

Figure 2H:
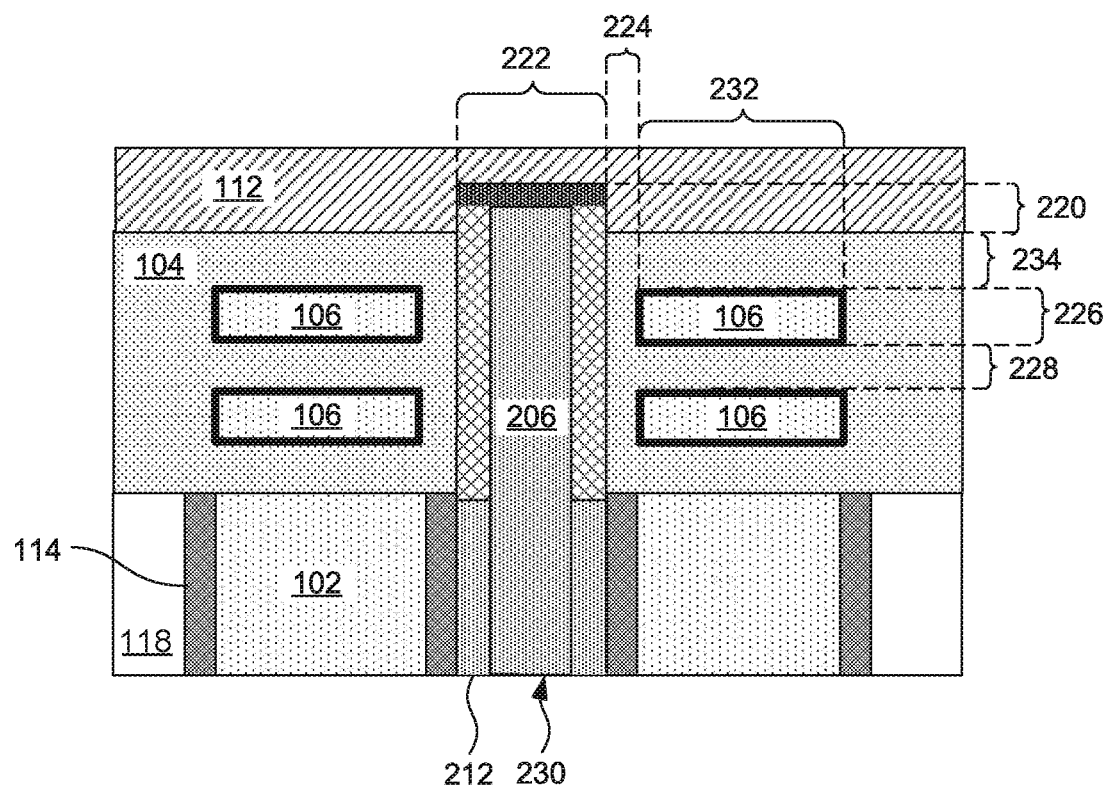

FIG. 2H is a diagram illustrating various dimensions. In one example, the width 222 of the backside gate cut feature is within a range of 7-40 nanometers. This range is small enough to have a small footprint on the chip while effectively isolating or "cutting" the gate feature. While the backside gate cut feature 230 is shown with substantially parallel sides, it may have a tapered shape as well. In such case, the gate cut feature 230 at the bottom below the gate structure 104 may have a width within a range of about 21-54 nanometers. The wider range at the bottom may result from a tapered shape gate cut feature. Again, this range is small enough to have a small footprint on the chip while effectively isolating or "cutting" the gate feature. The distance 224 between the gate cut feature 230 and the channel region may be within a range of about 3-20 nanometers. The distance 220 between the top surface of the gate structure 104 and the top surface of the gate cut feature 230 may be within a range of about 2-15 nanometers. This range is large enough to provide sufficient isolation without extending too deeply into the layer 112 and affecting layers above. The height 226 of the nanostructures 106 may be within a range of about 2-15 nanometers. The distance 228 between nanostructures may be within a range of about 3-20 nanometers. The width 232 of the nanostructures may be within a range of about 3-60 nanometers. nanometers. The distance 234 between the top surface of the top-most nanostructure 106 and the top surface of the gate structure 104 may be within a range of about 5-40 nanometers.

Figure 2I:
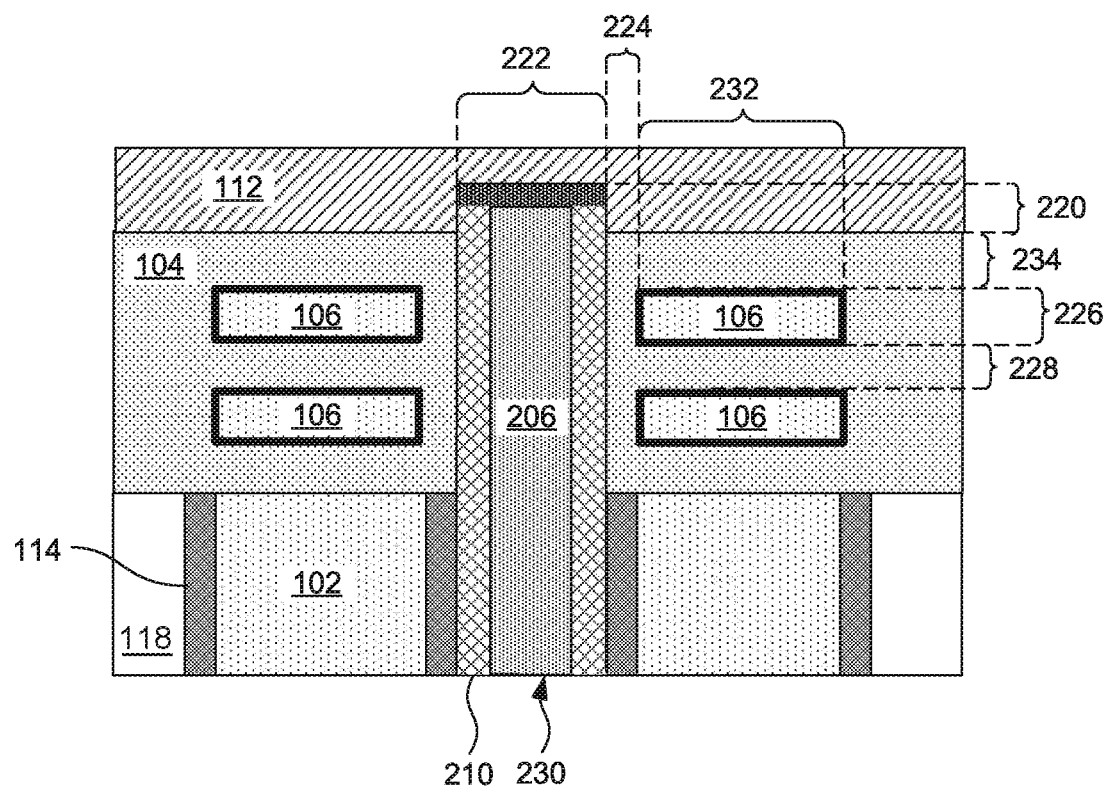
FIGS. 2I and 2J illustrate additional examples of a replacement material for a backside gate cut feature, according to one example of principles described herein.

FIG. 2I illustrates an example in which the work-function layer 210 extends to the bottom of isolation layer 110. In this example, the removal process described in FIG. 2F and the refill process of FIG. 2G are omitted. In this example, the spacers 114 serve to isolate the fin structure 102 from the work-function layer 210.

Figure 2J:
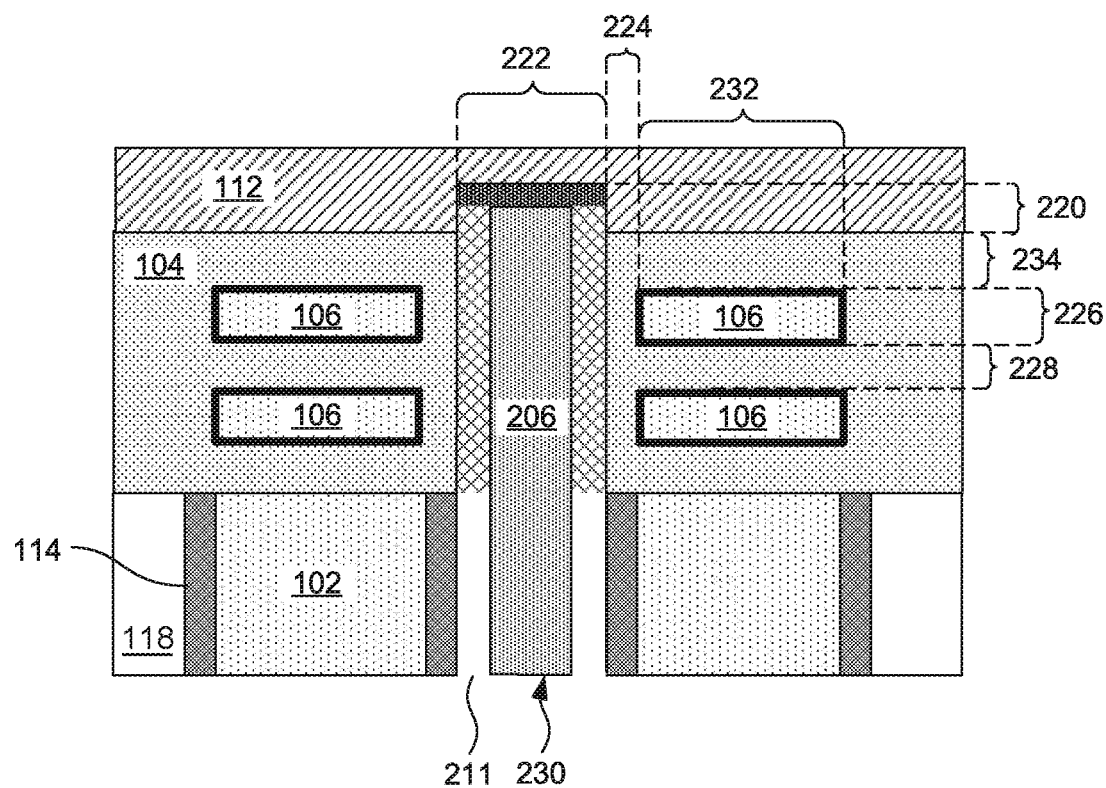

FIG. 2J illustrates an example in which an air spacer 211 is formed between the spacer material 114 and the isolation material 206. The air spacer 211 thus provides isolation between the spacer material 115 and the isolation material 206. This example may be achieved by omitting the refill process of FIG. 2G. In some examples, a sealing layer may be formed to seal the opening to the air spacer 211, thus creating an enclosed spacer.

Figure 3:
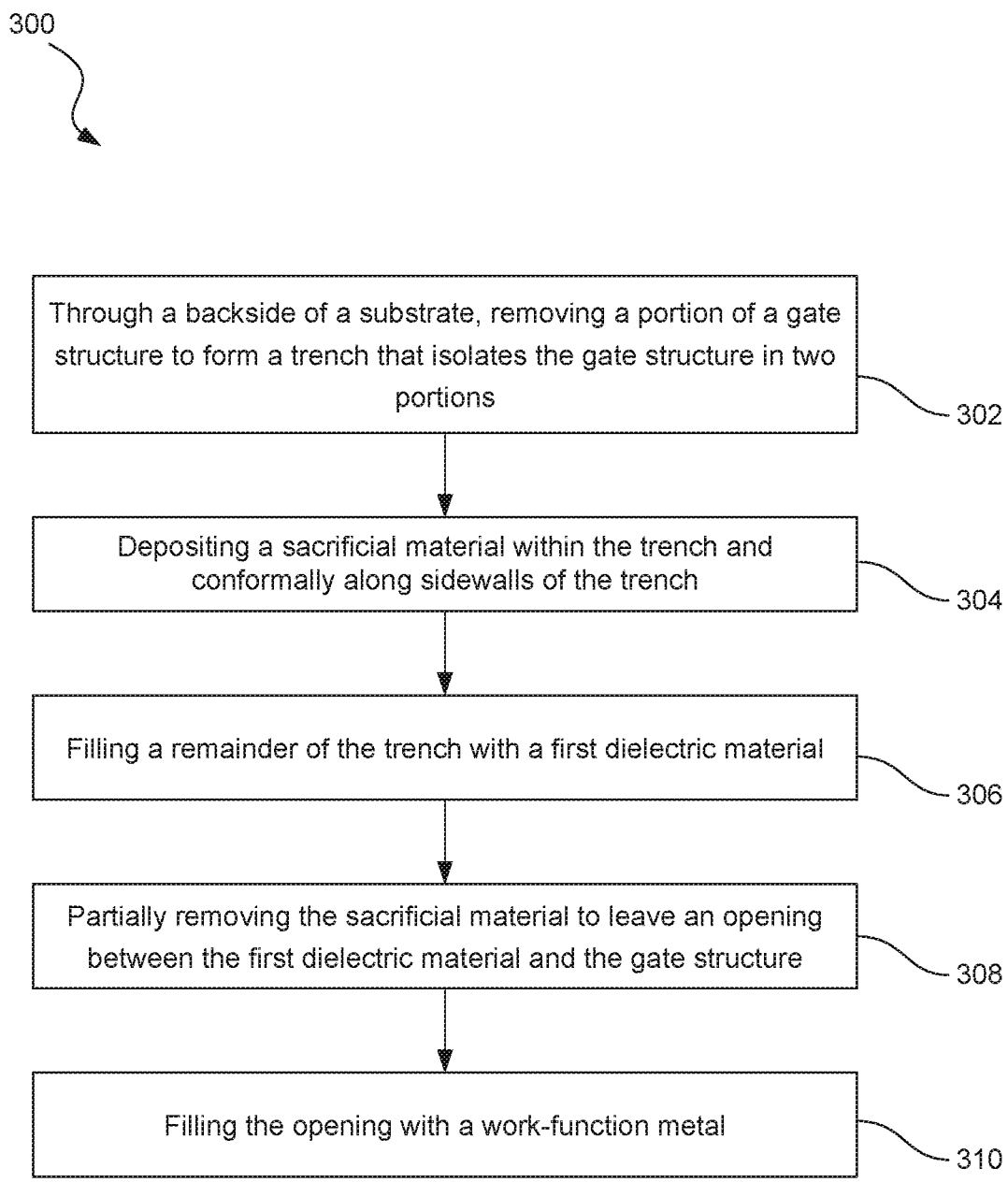
FIG. 3 is a flowchart showing an illustrative method for fabricating a semiconductor structure with replacement material for the backside gate cut feature, according to one example of principles described herein.

FIG. 3 is a flowchart showing an illustrative method for fabricating a semiconductor structure with replacement material for the backside gate cut feature (e.g., 230). According to the present example, the method 300 includes a process 302 for, through a backside of a substrate, removing a portion of a gate structure (e.g., 104) to form a trench (e.g., 202) that isolates the gate structure in two portions. This removal process may be an etching process. The etching process may be, for example, a dry etching process. The etching process also may extend slightly into an dielectric layer (e.g., 112) or another layer that is deposited on top of the gate structure 104.

The method 300 further includes a process 304 for depositing a sacrificial material (e.g., 204) within the trench and conformally along sidewalls of the trench. The sacrificial material may be deposited using a conformal deposition process such as CVD, or ALD. Other deposition methods are contemplated.

The method 300 further includes a process 306 for filling a remainder of the trench with a first dielectric material (e.g., 206). The dielectric material may be an oxide material such as silicon dioxide. Other oxides may be used as well. The oxide material has an etching selectivity with the sacrificial material formed along the walls of the trench. As will be explained more below, the etching selectivity allows the sacrificial material to be removed while the oxide layer remains substantially intact.

The method 300 further includes a process 308 for partially removing the sacrificial material to leave an opening (e.g., 208) between the first dielectric material and the gate structure. The removal process may be either a wet etching or a dry etching process. The etching process may continue until the ILD layer (or other layer above the gate structure) is exposed. A small portion of the sacrificial material may remain within the ILD layer. The removal process thus leaves an opening between the oxide and the gate structure. It is possible that the etching process may damage various work-function metal layers that surround the channels. Thus, as will be explained below, such damage can be repaired by depositing a work-function layer as described herein.

The method 300 further includes a process 310 for filling the opening with a work-function metal (e.g., 210). The work-function replacement layer may be one of a variety of metals depending on the type of transistor being formed. Various examples of a p-type work-function metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type work-function metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC). In some examples, the work-function layer 210 may be the same as that formed around the channel regions. However, in some examples, the work-function layer may be different than the one formed around the channel layers. The composition of the work-function layer may be customized for a specific device. This allows for finer tuning of the performance of the transistor device.

Figure 4:
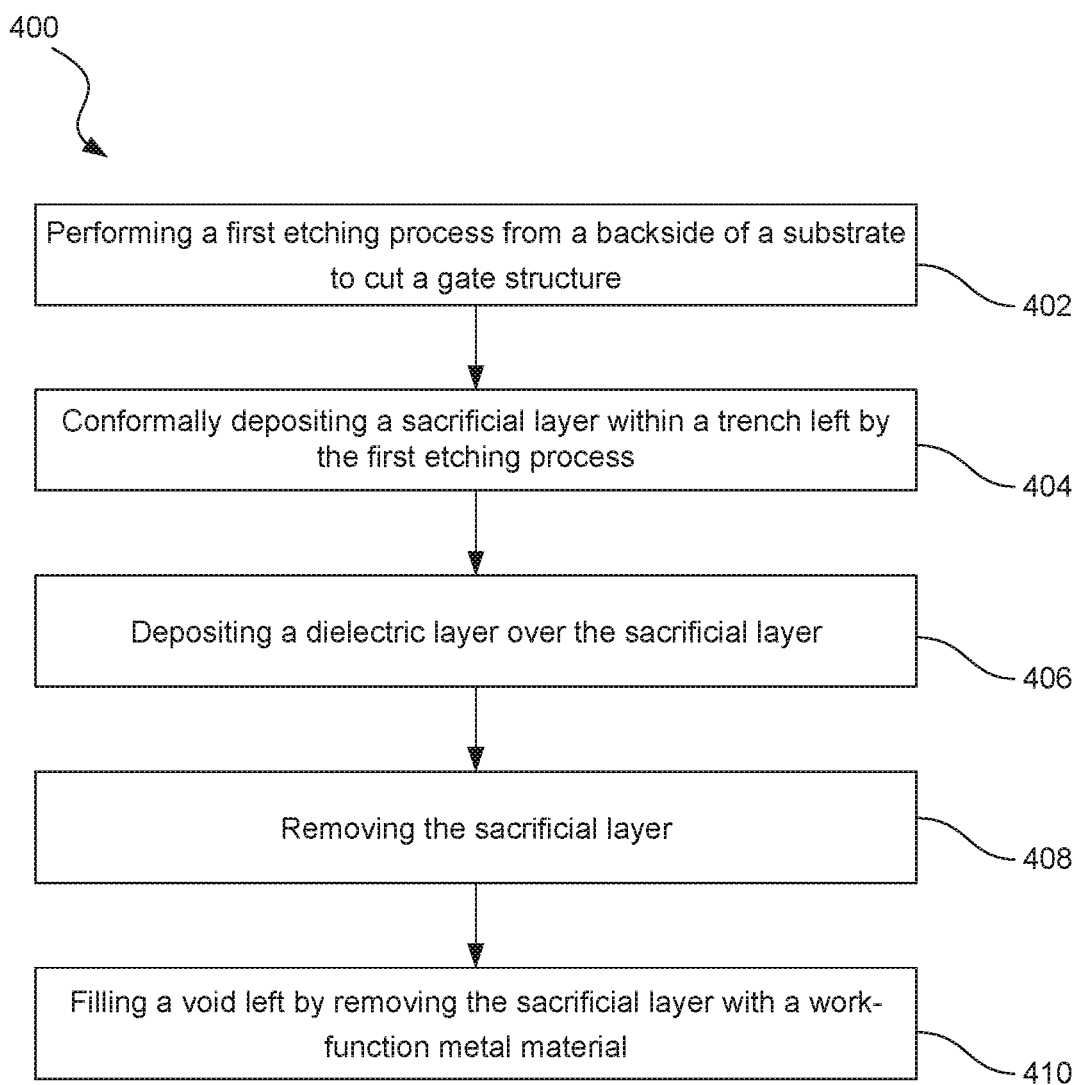
FIG. 4 is a flowchart showing an illustrative method for fabricating a semiconductor structure with replacement material for the backside gate cut feature, according to one example of principles described herein.

FIG. 4 is a flowchart showing an illustrative method 400 for fabricating a semiconductor structure with replacement material for the backside gate cut feature. According to the present example, the method 400 includes a process 402 for performing a first etching process from a backside of a substrate to cut a gate structure (e.g., 104). This removal process may be an etching process. The etching process may be, for example, a dry etching process. The etching process also may extend slightly into an dielectric layer (e.g., 112) or another layer that is deposited on top of the gate structure 104.

The method 400 further includes a process 404 for conformally depositing a sacrificial layer (e.g., 204) within a trench (e.g., 202) left by the first etching process. The sacrificial material may be deposited using a conformal deposition process such as CVD, or ALD. Other deposition methods are contemplated.

The method 400 further includes a process 406 for depositing a dielectric layer (e.g., 206) over the sacrificial layer. The dielectric material may be an oxide material such as silicon dioxide. Other oxides may be used as well. The oxide material has an etching selectivity with the sacrificial material formed along the walls of the trench. As will be explained more below, the etching selectivity allows the sacrificial material to be removed while the oxide layer remains substantially intact.

The method 400 further includes a process 408 for removing the sacrificial layer. The removal process may be either a wet etching or a dry etching process. The etching process may continue until the ILD layer (or other layer above the gate structure) is exposed. A small portion of the sacrificial material 204 may remain within the ILD layer. The removal process thus leaves an opening between the oxide and the gate structure. It is possible that the etching process may damage various work-function metal layers that surround the channels. Thus, as will be explained below, such damage can be repaired by depositing a work-function layer as described herein.

The method 400 further includes a process 410 for filling a void left by removing the sacrificial layer with a work-function metal material. The work-function replacement layer may be one of a variety of metals depending on the type of transistor being formed. Various examples of a p-type work-function metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type work-function metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC). In some examples, the work-function layer 210 may be the same as that formed around the channel regions. However, in some examples, the work-function layer may be different than the one formed around the channel layers. The composition of the work-function layer may be customized for a specific device. This allows for finer tuning of the performance of the transistor device.

In summary, a gate cut feature is formed from the backside of a substrate in a manner that improves the performance of transistor devices. To provide for better device performance, a new work-function metal layer is deposited within the space left by removing a function of the gate structure. Through a backside of a substrate, a portion of a gate structure is removed. This forms a trench that isolates the gate structure in two portions. Then, a sacrificial material is deposited within the trench conformally along sidewalls of the trench. Then, the remainder of the trench is filled with a dielectric material. The sacrificial material can then be at least partially removed to leave a space between the gate structure and the dielectric material. This space can then be filled with a replacement material such as a work-function metal. Thus, any damage that may be done to the gate structure during the etching process to form the trench, can be effectively repaired or mitigated.

According to one example, a method includes, through a backside of a substrate, removing a portion of a gate structure to form a trench that isolates the gate structure in two portions. The method further includes depositing a sacrificial material within the trench and conformally along sidewalls of the trench, filling a remainder of the trench with a first dielectric material, partially removing the sacrificial material to leave an opening between the first dielectric material and the gate structure, and filling the opening with a work-function metal.

According to one example, a method includes etching from a first side of a substrate to cut a gate structure over a second side of the substrate, conformally depositing a sacrificial layer within a trench left by the etching process, depositing a dielectric layer over the sacrificial layer, removing the sacrificial layer, and filling a void left by removing the sacrificial layer with a work-function metal material.

According to one example, a semiconductor structure includes a gate structure surrounding a plurality of channels and a cut feature that electrically isolates two separate portions of the gate structure. The cut feature comprises an outer layer having a work-function metal, and an inner layer comprising a dielectric material. The cut feature extends above a top surface of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a substrate;
a first gate structure and a second gate structure disposed over the substrate;
source/drain features on two sides of the first gate structure, wherein the first gate structure is interposed between the source/drain along a first direction;
an isolation feature extending through the substrate, wherein the isolation feature is interposed between the first gate structure and the second gate structure along a second direction perpendicular to the first direction; and
a spacer layer interposed between the isolation feature and the substrate along the second direction,
wherein a top surface of the isolation feature is above a topmost surface of the first gate structure,
wherein the first gate structure and the second gate structure align with each other along the second direction.

2. The semiconductor structure of claim 1, wherein the isolation feature comprises a dielectric material extending continuously through the substrate and a work function layer disposed along a sidewall of the dielectric material and between the dielectric material and the first gate structure.

3. The semiconductor structure of claim 2, wherein the isolation feature further comprises an oxide cap directly contacting a top surface of the dielectric material and a top surface of the work function layer.

4. The semiconductor structure of claim 2, wherein an upper portion of the sidewall of the dielectric material is lined by the work function layer, and
wherein a lower portion of the sidewall of the dielectric material is exposed to air.

5. The semiconductor structure of claim 2, wherein the isolation feature further comprises a dielectric layer disposed along the sidewall of the dielectric material and between the dielectric material and the substrate.

6. The semiconductor structure of claim 5, wherein the work function layer extends below a bottommost surface of the first gate structure.

7. The semiconductor structure of claim 1, further comprising an upper dielectric layer disposed on top surfaces of the first gate structure and the second gate structure,
wherein the isolation feature extends into the upper dielectric layer, and
wherein a top surface of the isolation feature is below a top surface of the upper dielectric layer.

8. The semiconductor structure of claim 1, further comprising a first stack of channel layers wrapped by the first gate structure and a second stack of channel layers wrapped by the second gate structure.

9. A semiconductor structure comprising:
a gate structure surrounding a plurality of channel layers, wherein the gate structure includes a first work-function layer wrapping around the plurality of channel layers and a gate electrode disposed over the first work-function layer;
an isolation feature separating the gate structure into two portions and electrically isolating the two portions, wherein the isolation feature comprises a portion below a bottommost surface of the gate structure; and
a second work-function layer disposed between the gate structure and the isolation feature, wherein a portion of the second work-function layer is disposed on a top portion of a sidewall of the portion of the isolation feature.

10. The semiconductor structure of claim 9, further comprising a dielectric layer disposed on a bottom portion of the sidewall of the portion of the isolation feature and below the second work-function layer.

11. The semiconductor structure of claim 9, further comprising a dielectric cap layer disposed on a top surface of the isolation feature and a top surface of the second work-function layer,
wherein a sidewall of the dielectric cap layer aligns with a sidewall of the second work-function layer.

12. The semiconductor structure of claim 9, further comprising an upper dielectric layer disposed on a top surface of the isolation feature and a top surface of the gate structure,
wherein the upper dielectric layer is in direct contact with a sidewall of the second work-function layer.

13. The semiconductor structure of claim 9, wherein a top surface of the second work-function layer is above a topmost surface of the gate structure.

14. The semiconductor structure of claim 9, further comprising a substrate disposed directly below the plurality of channel layers,
wherein the portion of the second work-function layer is disposed between the substrate and the isolation feature.

15. A semiconductor structure comprising:
a gate structure surrounding a plurality of channel layers;
a dielectric layer disposed over the gate structure;
an isolation feature extending through the gate structure and into the dielectric layer, wherein the isolation feature separates the gate structure into two portions; and
a work-function layer disposed between the isolation feature and the gate structure and in direct contact with the isolation feature,
wherein the work-function layer is disposed along a topmost sidewall of the gate structure.

16. The semiconductor structure of claim 15, further comprising a dielectric cap layer disposed above the isolation feature and the work-function layer and embedded in the dielectric layer.

17. The semiconductor structure of claim 16, wherein a sidewall of the dielectric cap layer aligns with a sidewall of the work-function layer.

18. The semiconductor structure of claim 15, further comprising a dielectric liner disposed below the work-function layer and in direct contact with the isolation feature and the work-function layer,
   wherein a sidewall of the dielectric liner aligns with a sidewall of the work-function layer.

19. The semiconductor structure of claim 15, wherein the isolation feature comprises a material continuously extending through the gate structure and to below a bottommost surface of the gate structure.

20. The semiconductor structure of claim 15, further comprising:
   a substrate disposed directly below the plurality of channel layers; and
   an air gap disposed between the isolation feature and the substrate.

\* \* \* \* \*